(12) United States Patent
Lee et al.

(10) Patent No.: US 8,937,371 B2
(45) Date of Patent: Jan. 20, 2015

(54) SEMICONDUCTOR DEVICE AND METHOD OF FORMING A SHIELDING LAYER OVER A SEMICONDUCTOR DIE DISPOSED IN A CAVITY OF AN INTERCONNECT STRUCTURE AND GROUNDED THROUGH THE DIE TSV

(71) Applicant: STATS ChipPAC, Ltd., Singapore (SG)

(72) Inventors: SinJae Lee, Kyoungki-do (KR); JinGwan Kim, Seoul (KR); JiHoon Oh, Kyoungki-do (KR); JaeHyun Lim, Kyoungki-do (KR); KyuWon Lee, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 7 days.

(21) Appl. No.: 13/935,312

(22) Filed: Jul. 3, 2013

(65) Prior Publication Data

US 2013/0292804 A1 Nov. 7, 2013

Related U.S. Application Data

(62) Division of application No. 12/605,292, filed on Oct. 23, 2009, now Pat. No. 8,531,012.

(51) Int. Cl.

| | |
|---|---|
| *H01L 23/552* | (2006.01) |
| *H01L 21/48* | (2006.01) |
| *H01L 23/498* | (2006.01) |
| *H01L 25/065* | (2006.01) |

(Continued)

(52) U.S. Cl.
CPC .......... *H01L 23/552* (2013.01); *H01L 21/4857* (2013.01); *H01L 23/49822* (2013.01); *H01L 25/0657* (2013.01); *H01L 21/486* (2013.01); *H01L 23/3128* (2013.01); *H01L 23/481* (2013.01); *H01L 23/49827* (2013.01); *H01L 2224/16225* (2013.01); *H01L 2224/48225* (2013.01); *H01L 2224/73265* (2013.01); *H01L 2225/0651* (2013.01); *H01L 2225/06517* (2013.01); *H01L 2225/06541* (2013.01); *H01L 2225/06572* (2013.01); *H01L 2924/09701* (2013.01); *H01L 2924/15156* (2013.01);

(Continued)

(58) Field of Classification Search
USPC ................... 257/660, 99, 621, 659
See application file for complete search history.

(56) References Cited

U.S. PATENT DOCUMENTS

| | | | |
|---|---|---|---|
| 4,943,844 A | 7/1990 | Oscilowski et al. | |
| 5,963,429 A | 10/1999 | Chen | |

(Continued)

*Primary Examiner* — Zandra Smith
*Assistant Examiner* — Lawrence Tynes, Jr.
(74) *Attorney, Agent, or Firm* — Robert D. Atkins; Patent Law Group: Atkins and Associates, P.C.

(57) ABSTRACT

A semiconductor device has an interconnect structure with a cavity formed partially through the interconnect structure. A first semiconductor die is mounted in the cavity. A first TSV is formed through the first semiconductor die. An adhesive layer is deposited over the interconnect structure and first semiconductor die. A shielding layer is mounted over the first semiconductor die. The shielding layer is secured to the first semiconductor die with the adhesive layer and grounded through the first TSV and interconnect structure to block electromagnetic interference. A second semiconductor die is mounted to the shielding layer and electrically connected to the interconnect structure. A second TSV is formed through the second semiconductor die. An encapsulant is deposited over the shielding layer, second semiconductor die, and interconnect structure. A slot is formed through the shielding layer for the encapsulant to flow into the cavity and cover the first semiconductor die.

24 Claims, 7 Drawing Sheets

(51) Int. Cl.
*H01L 23/31* (2006.01)
*H01L 23/48* (2006.01)
*H01L 23/00* (2006.01)

(52) U.S. Cl.
CPC ....... *H01L2924/15311* (2013.01); *H01L 24/48* (2013.01); *H01L 2924/01322* (2013.01); *H01L 2224/32225* (2013.01); *H01L 2924/13091* (2013.01); *H01L 2924/3025* (2013.01)
USPC ............................ 257/660; 257/621; 257/659

(56) References Cited

U.S. PATENT DOCUMENTS

| | | | |
|---|---|---|---|
| 6,890,798 B2 | 5/2005 | McMahon | |
| 2001/0020546 A1* | 9/2001 | Eldridge et al. | 174/261 |
| 2007/0278632 A1* | 12/2007 | Zhao et al. | 257/676 |
| 2008/0251895 A1* | 10/2008 | Patterson | 257/660 |
| 2009/0230487 A1* | 9/2009 | Saitoh et al. | 257/419 |
| 2010/0078832 A1 | 4/2010 | Theuss | |

* cited by examiner

SEMICONDUCTOR DEVICE AND METHOD OF FORMING A SHIELDING LAYER OVER A SEMICONDUCTOR DIE DISPOSED IN A CAVITY OF AN INTERCONNECT STRUCTURE AND GROUNDED THROUGH THE DIE TSV

CLAIM TO DOMESTIC PRIORITY

The present application is a divisional of U.S. patent application Ser. No. 12/605,292, now U.S. Pat. No. 8,531,012, filed Oct. 23, 2009, which application is incorporated herein by reference.

FIELD OF THE INVENTION

The present invention relates in general to semiconductor devices and, more particularly, to a semiconductor device and method of mounting a shielding layer over a semiconductor die disposed in a cavity of a build-up interconnect structure and grounding the shielding layer through TSV formed in the die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk, which can interfere with their operation.

SUMMARY OF THE INVENTION

A need exists to reduce EMI, RFI, and other inter-device interference between semiconductor devices. Accordingly, in one embodiment, the present invention is a semiconductor device comprising a substrate including a cavity and first semiconductor die or component disposed in the cavity of the substrate. A first conductive via is formed through the first semiconductor die or component. A shielding layer is disposed over the first semiconductor die or component and electrically connected to the first conductive via. An encapsulant is deposited over the shielding layer and substrate and further through an opening in the shielding layer over the semiconductor die or component.

In another embodiment, the present invention is a semiconductor device comprising a substrate and first semiconductor die or component disposed in a cavity of the substrate. A shielding layer is disposed over the first semiconductor die or component. An encapsulant is deposited over the shielding layer and substrate and further through an opening in the shielding layer over the semiconductor die or component.

In another embodiment, the present invention is a semiconductor device comprising a substrate and first semiconductor die or component disposed in a cavity of the substrate. A planar shielding layer is disposed over the substrate and first semiconductor die or component. An encapsulant is deposited over the planar shielding layer and substrate.

In another embodiment, the present invention is a semiconductor device comprising a substrate and first semiconductor die or component disposed in a cavity of the substrate. A planar shielding layer is disposed over the first semiconductor die or component.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
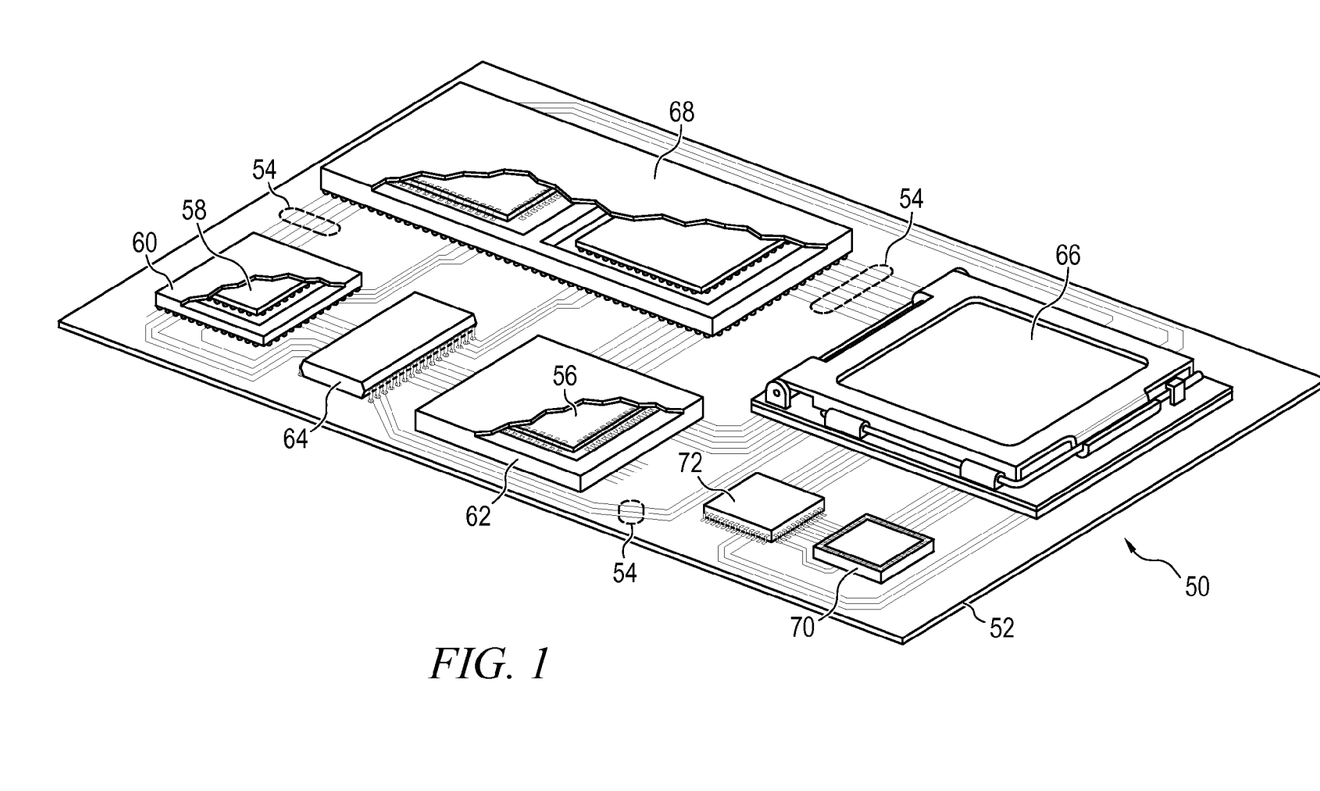
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
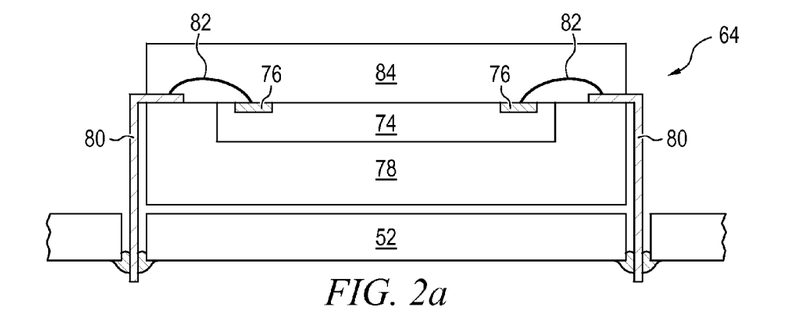
FIGS. 2a-2c illustrate further detail of the representative semiconductor packages mounted to the PCB.
Figure 2B:
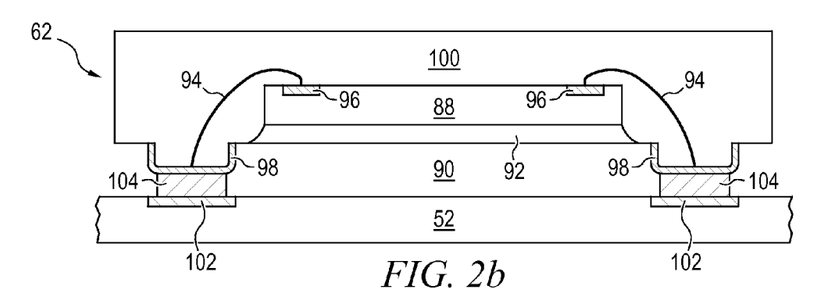
Figure 2C:
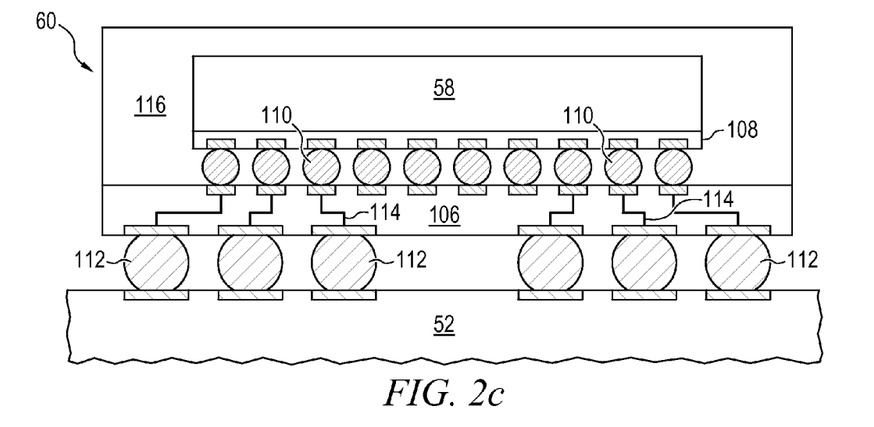

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

FIGS. 3-5 illustrate, in relation to FIGS. 1 and 2a-2c, a process of mounting a shielding layer over a semiconductor die disposed in a cavity of a build-up interconnect structure and grounding the shielding layer through TSV formed in the die. In FIG. 3a, a substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. An interface layer or tape 121 is applied over carrier 120 as a temporary adhesive bonding film or etch-stop layer.

Figure 3A:
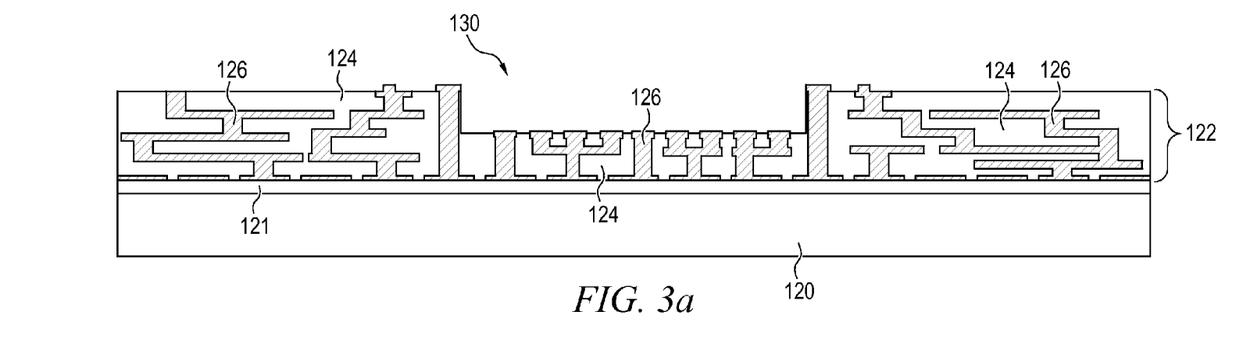
FIGS. 3a-3f illustrate a process of mounting a shielding layer over a semiconductor die disposed in a cavity of an interconnect structure and grounded through the die TSV.

A build-up interconnect structure 122 is formed over interface layer 121 of carrier 120. The build-up interconnect structure 122 includes an insulating or passivation layer 124 deposited as one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 124 is formed using PVD, CVD, printing, spin coating, spray coating, sintering or thermal oxidation. A portion of insulating layers 124 is removed by an etching process. Conductive layer 126 is formed as one or more layers in the removed portions of insulating layer 124 using patterning with PVD, CVD, sputtering, electrolytic plating, electroless plating, or other suitable metal deposition process. Conductive layer 126 can be one or more layers of Al, Cu, Sn, Ni, Au, Ag, or other suitable electrically conductive material. Portions of conductive layer 126 can be electrically common or electrically isolated depending on the design and function of the semiconductor device.

An open cavity 130 is formed partially through build-up interconnect structure 122 by laser cutting or deep reactive ion etching (DRIE). Cavity 130 has sufficient area and depth to contain a semiconductor die.

Figure 3B:
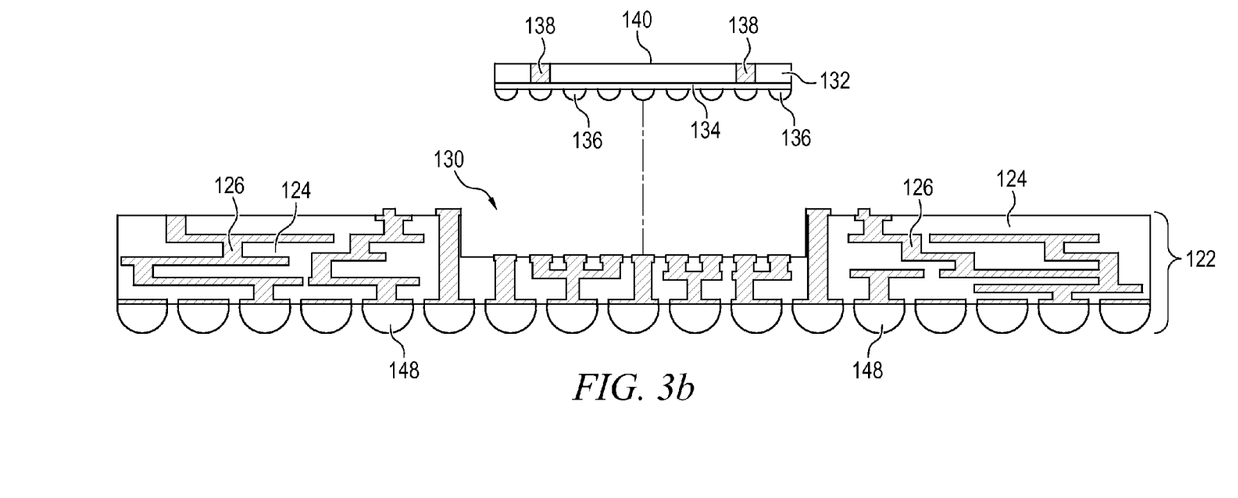

FIG. 3b shows a semiconductor die or component 132 having an active surface 134 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 134 to implement analog circuits or digital circuits, such as digital signal processor (DSP), ASIC, memory, or other signal processing circuit. Semiconductor die 132 may also contain IPDs, such as inductors, capacitors, and resistors, for RF signal processing. Bumps 136 are formed on active surface 134 for electrical interconnect. In one embodiment, semiconductor die 132 is implemented as a flipchip type semiconductor package.

Semiconductor die 132 may contain IPDS that are susceptible to EMI, RFI, or other inter-device interference. In other embodiments, semiconductor die 132 contain high frequency baseband circuits that generate EMI, RFI, and inter-device interference. The IPDs provide electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

Figure 4A:
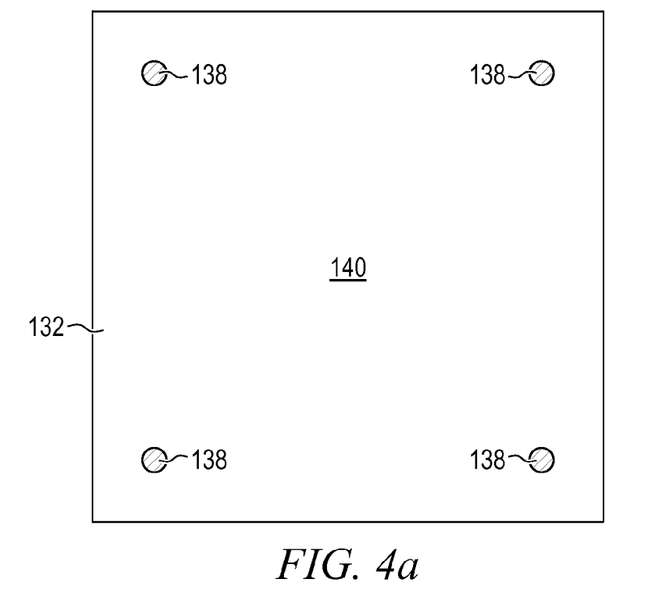
FIGS. 4a-4b illustrate TSV formed in the semiconductor die.
Figure 4B:
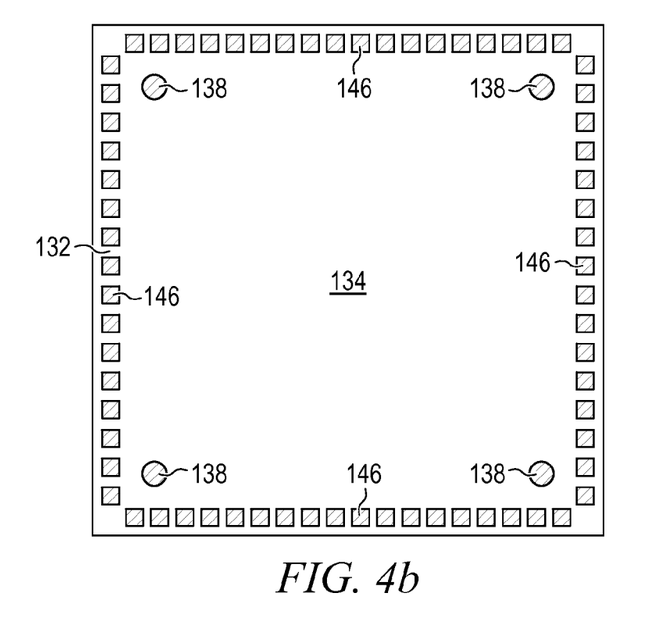

A plurality of vias is formed through semiconductor die 132 using laser drilling or etching process, such as DRIE. The vias are filled with Al, Cu, Sn, Ni, Au, Ag, titanium (Ti), W, poly-silicon, or other suitable electrically conductive material using PVD, CVD, electrolytic plating, electroless plating, or other suitable metal deposition process to form conductive through silicon vias (TSV) 138. FIG. 4a shows back surface 140 of semiconductor die 132 with exposed TSV 138. FIG. 4b shows active surface 134 of semiconductor die 132 with exposed TSV 138 and contact pads 146. Bumps 136 are formed over contact pads 146 on active surface 134.

Returning to FIG. 3b, semiconductor die 132 is positioned over open cavity 130. The carrier 120 and optional interface layer 121 are removed by chemical etching, mechanical peel-off, CMP, mechanical grinding, thermal bake, laser scanning, or wet stripping. An electrically conductive bump material is deposited over build-up interconnect structure 122 and electrically connected to conductive layer 126 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 126 using a suitable attachment or bonding process. In one embodiment, the bump material is reflowed by heating the material above its melting point to form spherical balls or bumps 148. In some applications, bumps 148 are reflowed a second time to improve electrical contact to conductive layer 126. The bumps can also be compression bonded to conductive layer 126. Bumps 148 represent one type of interconnect structure that can be formed over conductive layer 126. The interconnect structure can also use bond wires, stud bump, micro bump, or other electrical interconnect.

Figure 3C:
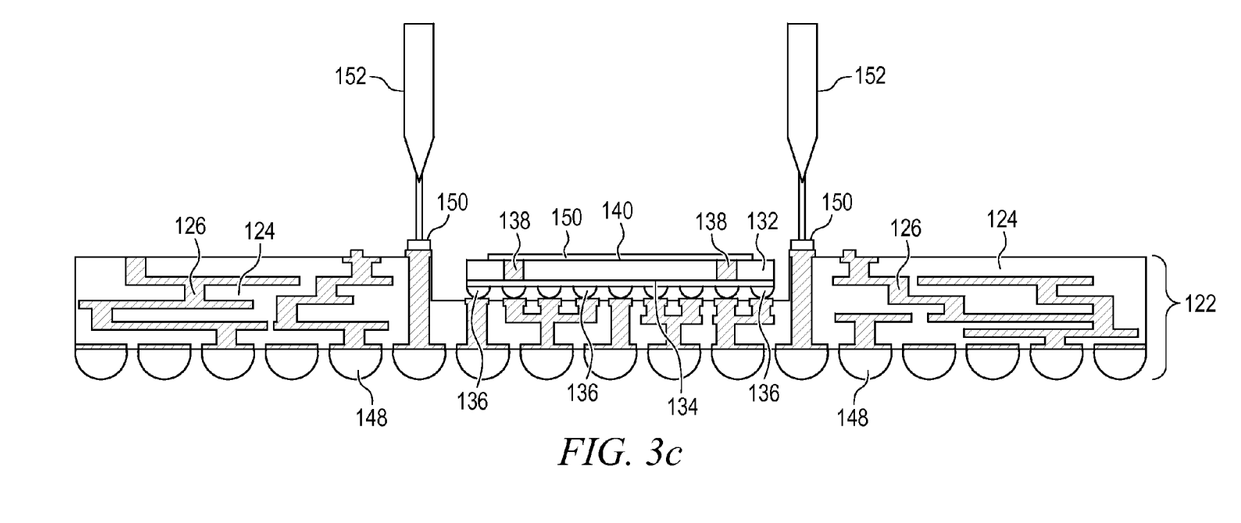

In FIG. 3c, semiconductor die 132 is placed within open cavity 130. A back surface 140 of semiconductor die 132 is substantially co-planar with the top surface of build-up interconnect structure 122. An adhesive layer 150, such as conductive epoxy, is deposited over back surface 140 of semiconductor die 132 and over a portion of build-up interconnect structure 122 using dispenser 152.

Figure 3D:
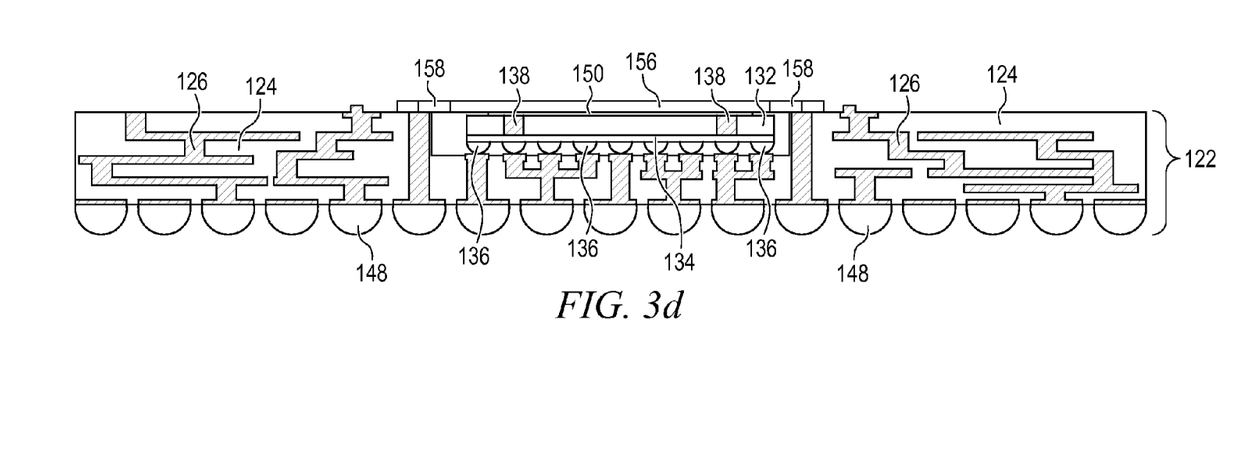

In FIG. 3d, a conductive spacer 156 is mounted over cavity 130 and secured with adhesive layer 150. Conductive spacer 156 operates as an EMI or RFI shielding layer. Conductive spacer 156 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. The shielding layer can also be a non-metal material such as carbon-black or aluminum flake to reduce the effects of EMI and RFI. Conductive spacer 156 is grounded through TSV 138, as well as conductive layer 126 and bumps 136 and 148.

Figure 3E:
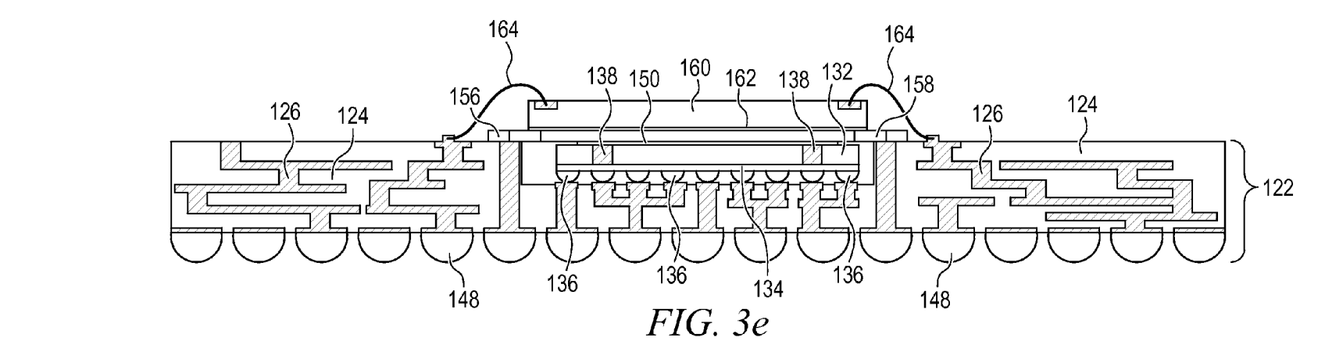

In FIG. 3e, a semiconductor die or component 160 is mounted to a surface of conductive spacer 156, opposite semiconductor die 132, with an adhesive layer 162. Semiconductor die 160 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 160 may also contain IPDS, such as inductors, capacitors, and resistors, for RF signal processing. Bond wires 164 are formed between contact pads on semiconductor die 160 and conductive layer 126.

Figure 3F:
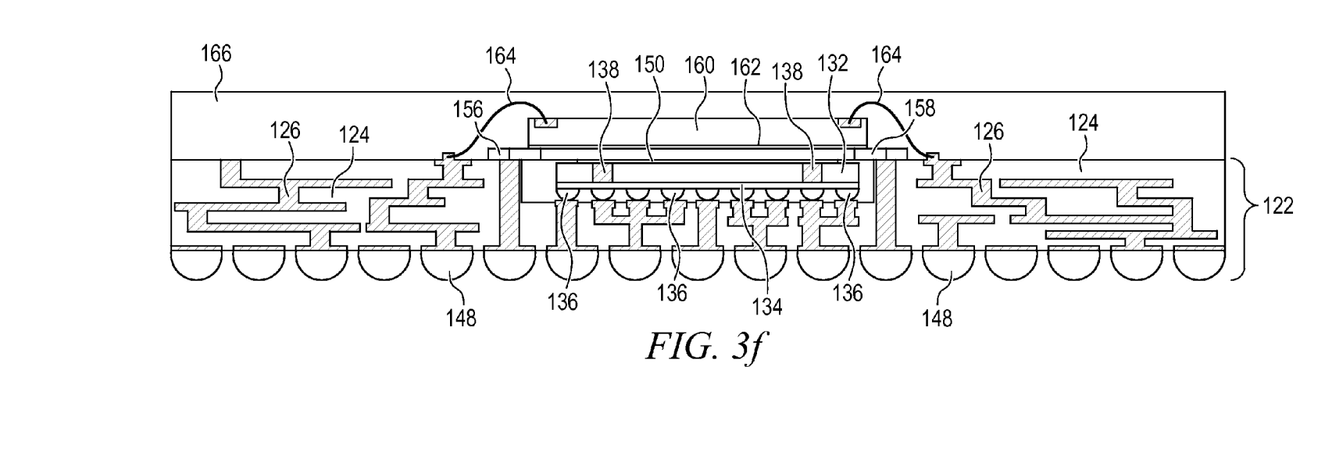
Figure 5:
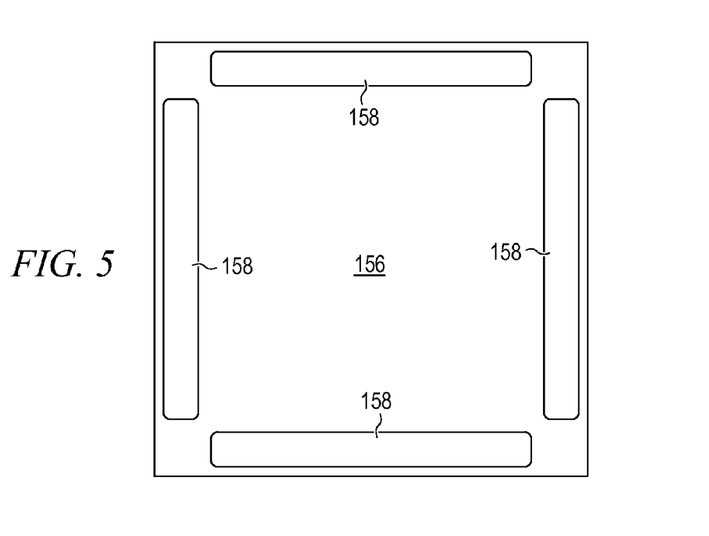
FIG. 5 illustrates further detail of the shielding layer with slots for flow-through of the encapsulant material.

In FIG. 3f, an encapsulant or molding compound 166 is deposited over build-up interconnect structure 122 and semiconductor die 160 using a paste printing, compressive molding, transfer molding, liquid encapsulant molding, vacuum lamination, spin coating, or other suitable applicator. During the application process, encapsulant 166 flows through slots 158 formed in shielding layer 156 into cavity 130 to cover semiconductor die 132. FIG. 5 shows a top view of slots 158 formed in conductive spacer 156. Encapsulant 166 can be polymer composite material, such as epoxy resin with filler, epoxy acrylate with filler, or polymer with proper filler. Encapsulant 166 is non-conductive and environmentally protects the semiconductor device from external elements and contaminants.

Conductive spacer 156 isolates EMI, RFI, and other inter-device interference between semiconductor die 132 and semiconductor die 160. Conductive spacer 156 is grounded through TSV 138, as well as conductive layer 126 and bumps 136 and 148 to suppress EMI and RFI. By placing semiconductor die 132 in cavity 130, the overall height of the semiconductor device is also reduced.

Figure 6:
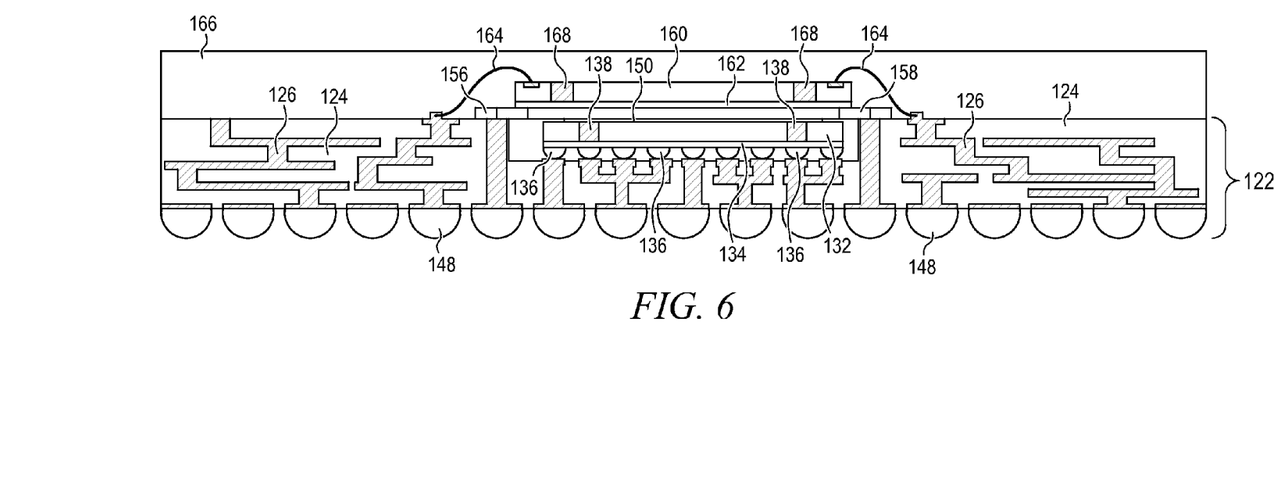
FIG. 6 illustrates TSV formed in the semiconductor die mounted over the shielding layer.

An alternate embodiment is shown in FIG. 6, using the embodiment from FIG. 3-5, with TSV 168 formed in semiconductor die 160. A plurality of vias is formed through semiconductor die 160 using laser drilling or etching process, such as DRIE. The vias are filled with Al, Cu, Sn, Ni, Au, Ag, Ti, W, poly-silicon, or other suitable electrically conductive material using PVD, CVD, electrolytic plating, electroless plating, or other suitable metal deposition process to form conductive TSV 168 for additional vertical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate including a cavity;
   a first semiconductor die or component disposed in the cavity of the substrate;
   a first conductive via formed through the first semiconductor die or component;
   a shielding layer disposed over the first semiconductor die or component and electrically connected to the first conductive via; and
   an encapsulant deposited over the shielding layer and substrate and further through an opening in the shielding layer over the semiconductor die or component.

2. The semiconductor device of claim 1, wherein the opening in the shielding layer includes a slot extending along a length of the shielding layer to dispense the encapsulant into the cavity over the first semiconductor die or component.

3. The semiconductor device of claim 1, wherein the shielding layer is planar with the substrate.

4. The semiconductor device of claim 1, further including a second semiconductor die or component disposed over the shielding layer.

5. The semiconductor device of claim 1, further including a second conductive via formed through the substrate.

6. The semiconductor device of claim 1, wherein the shielding layer blocks electromagnetic interference.

7. A semiconductor device, comprising:
   a substrate;
   a first semiconductor die or component disposed in a cavity of the substrate;
   a shielding layer disposed over the first semiconductor die or component; and
   an encapsulant deposited over the shielding layer and substrate and into the cavity of the substrate over the first semiconductor die or component.

8. The semiconductor device of claim 7, further including a conductive via formed through the first semiconductor die or component.

9. The semiconductor device of claim 7, wherein the shielding layer includes an opening.

10. The semiconductor device of claim 7, wherein a surface of the first semiconductor die or component is substantially co-planar with a surface of the substrate.

11. The semiconductor device of claim 7, further including a second semiconductor die or component disposed over the shielding layer.

12. The semiconductor device of claim 7, further including a conductive via formed through the substrate.

13. The semiconductor device of claim 7, wherein the shielding layer blocks electromagnetic interference.

14. A semiconductor device, comprising:
   a substrate;
   a first semiconductor die or component disposed in a cavity of the substrate;
   a planar shielding layer disposed over the first semiconductor die or component and including an opening disposed over the cavity of the substrate; and
   an encapsulant deposited into the cavity of the substrate over the first semiconductor die or component.

15. The semiconductor device of claim 14, wherein the opening in the planar shielding layer extends along a length of the planar shielding layer.

16. The semiconductor device of claim 14, further including a conductive via formed through the first semiconductor die or component.

17. The semiconductor device of claim 14, further including a second semiconductor die or component disposed over the planar shielding layer.

18. The semiconductor device of claim 14, further including a conductive via formed through the substrate.

19. The semiconductor device of claim 18, wherein the planar shielding is electrically connected to the conductive via.

20. A semiconductor device, comprising:
   a substrate;
   a first semiconductor die or component disposed in a cavity of the substrate;
   a planar shielding layer disposed over the first semiconductor die or component and electrically connected to the substrate; and
   a second semiconductor die or component disposed over the planar shielding layer.

21. The semiconductor device of claim 20, further including an encapsulant deposited over the planar shielding layer and substrate.

22. The semiconductor device of claim 20, further including an opening formed in the planar shielding layer.

23. The semiconductor device of claim 20, wherein a surface of the first semiconductor die or component is substantially co-planar with a surface of the substrate.

24. The semiconductor device of claim 20, further including a conductive via formed through the first semiconductor die or component.

* * * * *